US012813280B2

(12) United States Patent
Lee et al.

(10) Patent No.: US 12,813,280 B2
(45) Date of Patent: Nov. 24, 2026

(54) ANTENNA MODULE, SEMICONDUCTOR DEVICE AND METHODS FOR MAKING THE SAME

(71) Applicant: STATS ChipPAC Pte. Ltd., Singapore (SG)

(72) Inventors: HunTeak Lee, Gyeongi-do (KR); SangHo Song, Incheon (KR); YeonJee Lee, Gyeonggi-do (KR)

( * ) Notice: Subject to any disclaimer, the term of this patent is extended or adjusted under 35 U.S.C. 154(b) by 693 days.

(21) Appl. No.: 18/334,375

(22) Filed: Jun. 14, 2023

(65) Prior Publication Data

US 2023/0411831 A1 Dec. 21, 2023

(30) Foreign Application Priority Data

Jun. 17, 2022 (CN) ......................... 202210691517.4

(51) Int. Cl.

| | |
|---|---|
| ***H01Q 1/40*** | (2006.01) |
| ***H01Q 1/24*** | (2006.01) |
| ***H10W 42/20*** | (2026.01) |
| ***H10W 44/00*** | (2026.01) |
| ***H10W 44/20*** | (2026.01) |
| ***H10W 70/685*** | (2026.01) |

(Continued)

(52) U.S. Cl.

CPC ............ *H10W 42/20* (2026.01); *H01Q 1/243* (2013.01); *H01Q 1/40* (2013.01); *H10W 44/20* (2026.01); *H10W 44/501* (2026.01); *H10W 70/685* (2026.01); *H10W 74/01* (2026.01); *H10W 74/117* (2026.01); *H10W 90/701* (2026.01); *H10W 44/248* (2026.01)

(58) Field of Classification Search

CPC ........... H01Q 1/38; H01Q 1/40; H01Q 1/243; H01Q 1/526; H01Q 1/2283; H01Q 21/065; H01L 23/645; H01L 23/49816

See application file for complete search history.

(56) References Cited

U.S. PATENT DOCUMENTS 10,396,047 B2 8/2019 Ong et al.
11,652,273 B2 * 5/2023 Liu ..................... H01Q 1/2283 343/795

(Continued)

FOREIGN PATENT DOCUMENTS

CN 109273823 A 1/2019
CN 109390667 A 2/2019

(Continued)

OTHER PUBLICATIONS

The Search Report for the counterpart Chinese patent application 202210691517.4, mailed on Jan. 19, 2026.

(Continued)

*Primary Examiner* — Tung X Le
(74) *Attorney, Agent, or Firm* — Junhe Law Office P.C.; Yi Zhang

(57) ABSTRACT

An antenna module comprises: an antenna body comprising a first surface for attaching the antenna module to an external substrate, and a second surface through which the antenna module transmits and receives electromagnetic signals, wherein the first surface is opposite to the second surface; an antenna conductive pattern formed within the antenna body; and a shielding fence laterally surrounding the antenna conductive pattern for shielding electromagnetic interferences.

17 Claims, 11 Drawing Sheets

(51) Int. Cl.

*H10W 74/01* (2026.01)
*H10W 74/10* (2026.01)
*H10W 90/00* (2026.01)

(56) References Cited

U.S. PATENT DOCUMENTS

| | | | | |
|---|---|---|---|---|
| 2006/0145361 | A1 | 7/2006 | Yang et al. | |
| 2016/0035680 | A1 | 2/2016 | Wu | |
| 2017/0077039 | A1 | 3/2017 | Liao et al. | |
| 2019/0051989 | A1 | 2/2019 | Kim et al. | |
| 2019/0326672 | A1* | 10/2019 | Lim | H01Q 19/30 |
| 2020/0220250 | A1* | 7/2020 | Chih | H01Q 1/2283 |
| 2021/0066814 | A1* | 3/2021 | Kim | H01Q 1/2283 |
| 2021/0091017 | A1* | 3/2021 | Yeon | H01Q 1/2283 |
| 2023/0014567 | A1* | 1/2023 | Yeon | H01Q 1/2283 |

FOREIGN PATENT DOCUMENTS

| | | | |
|---|---|---|---|
| CN | 110010503 | A | 7/2019 |
| CN | 110061345 | A | 7/2019 |
| CN | 110349937 | A | 10/2019 |
| CN | 113410630 | A | 9/2021 |

OTHER PUBLICATIONS

The Search Report for the counterpart Chinese patent application 202210691517.4, mailed on Jul. 27, 2026.

H. M. Cheema and A. Shamim, “The Last Barrier: On-Chip Antennas,” IEEE Microwave Magazine, vol. 14, No. 1, pp. 79-91, Jan. 2013.

Cui Lujing, Zhang Zhaohua, Hu Yongfang, Ji Le. Packaging Technology for Ka-band T/R Modules Based on LTCC Thick-thin Film Hybrid Substrate[J]. Modern Radar, 2017, 39(9): 86-89.

* cited by examiner

ANTENNA MODULE, SEMICONDUCTOR DEVICE AND METHODS FOR MAKING THE SAME

TECHNICAL FIELD

The present application generally relates to semiconductor packaging technology, and more particularly, to an antenna module, a semiconductor device and methods for making the same.

BACKGROUND OF THE INVENTION

The semiconductor industry is constantly faced with complex integration challenges as consumers want their electronic products to be lighter, smaller and have higher performance with more and more functionalities. One of the solutions is System-in-Package (SiP). SiP is a functional electronic system or sub-system that includes in a single package two or more heterogeneous semiconductor die, such as a logic chip, a memory, integrated passive devices (IPD), RF filters, sensors, heat sinks, or antennas.

Furthermore, semiconductor chips with processing circuits are required to be integrated with antennas as the 5$^{th}$ generation mobile communication technology (5G) using millimeter waves are developing rapidly. One of the solutions is Antenna in Package (AiP). AiP implements an antenna or antennas integrated into a package to reduce the size of semiconductor packages. In conventional AiPs, there are a lot of passive components attached beside of semiconductor chips for better interaction. As the chip size is increased for performance improvement to smoothly implement the 5G communication, the chips should occupy more space on the substrate.

Another problem for the above semiconductor packages is how to reduce interferences such as electromagnetic interference (EMI) between the components in a single package. Typically, a semiconductor device may be provided with a metal cover or a uniformly spread coating around its outer periphery as a shielding layer, which can shield off EMI noises. However, some components (e.g., antennas) in the semiconductor package are required to be exposed without shielding layer covered, for example, for connection or transmission purpose.

Therefore, a need exists for providing a semiconductor device such as AiPs with an improved layout and internal connections.

SUMMARY OF THE INVENTION

An objective of the present application is to provide a semiconductor device with an improved layout and internal connections.

According to an aspect of the present application, an antenna module comprises an antenna body comprising a first surface for attaching the antenna module to an external substrate, and a second surface through which the antenna module transmits and receives electromagnetic signals, wherein the first surface is opposite to the first surface; an antenna conductive pattern formed within the antenna body; and a shielding fence laterally surrounding the antenna conductive pattern for shielding electromagnetic interferences.

According to another aspect of the present application, a method for making an antenna module, comprises: providing an antenna strip, wherein the antenna strip comprises a plurality of antenna conductive patterns and a plurality of shielding fences each laterally surrounding an antenna conductive pattern, wherein each two adjacent shielding fences is connected together at a shared side wall; and singulating the antenna strip at the shared side walls of each two adjacent shielding fences to separate the plurality of antenna conductive patterns from each other, wherein the shared side walls are thicker than a corresponding portion of the antenna strip that is removed due to the singulation such that each of the separated antenna conductive patterns is laterally surrounded by a shielding fence after the singulation.

According to yet another aspect of the present application, a method for making an antenna module, comprises: providing an antenna strip, wherein the antenna strip comprises a plurality of antenna conductive patterns and a plurality of shielding fences each laterally surrounding an antenna conductive pattern, wherein each two adjacent shielding fences is spaced apart from each other via an isolation area; and singulating the antenna strip at the isolation areas to separate the plurality of antenna conductive patterns from each other, wherein the isolation areas are thicker than a corresponding portion of the antenna strip that is removed due to the singulation such that each of the separated antenna conductive patterns is laterally surrounded by a shielding fence after the singulation.

According to yet another aspect of the present application, a method for making an antenna module, comprises providing an antenna strip comprising a plurality of antenna conductive patterns, wherein the antenna strip comprises a first surface and a second surface opposite to the second surface; mounting solder connects on the second surface of the antenna strip, wherein the solder connects are electrically connected to the plurality of antenna conductive patterns; attaching a deposition mask on either of the first surface and the second surface of the antenna strip; singulating the antenna strip to separate the plurality of antenna conductive patterns from each other; depositing a shielding material on the deposition mask and lateral surfaces of each of the separated antenna conductive patterns; and removing the deposition mask and the shielding material deposited thereon.

According to yet another aspect of the present application, a semiconductor device, comprises: a substrate comprising a first surface, a second surface opposite to the first surface, and substrate conductive patterns that extend between the first surface and the second surface; an antenna module attached on the first surface of the substrate, the antenna module comprising: an antenna body, an antenna conductive pattern formed within the antenna body, and a shielding fence laterally surrounding the antenna conductive pattern for shielding electromagnetic interferences; a first electronic component attached on the first surface of the substrate and besides the antenna module; a second electronic component attached on the second surface of the substrate, wherein the second electronic component is coupled to the first electronic component and the antenna module through at least two of the substrate conductive patterns; and a shielding layer formed on the second electronic component for shielding electronic interferences.

According to yet another aspect of the present application, a method for making a semiconductor device, comprises: providing a substrate comprising a first surface, a second surface opposite to the first surface and substrate conductive patterns that extend between the first surface and the second surface; attaching a first electronic component on the first surface of the substrate and besides the antenna module; attaching an antenna module on the first surface of the substrate, the antenna module comprising: an antenna body, an antenna conductive pattern formed within the antenna body, and a shielding fence laterally surrounding the antenna conductive pattern for shielding electromagnetic interferences; attaching a second electronic component on the second surface of the substrate, wherein the second electronic component is coupled to the first electronic component and the antenna module through at least two of the substrate conductive patterns; and forming a shielding layer on the second electronic component for shielding electronic interferences.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "over", "on", "top", "bottom", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

In a conventional semiconductor device with antenna-in-package, there are a lot of electronic components attached on one surface of a substrate. For example, a lot of discrete components, such as decoupling capacitors, are attached on a top surface of the substrate and besides a semiconductor die, thereby the space for mounting the semiconductor die on the substrate is limited.

Figure 1:
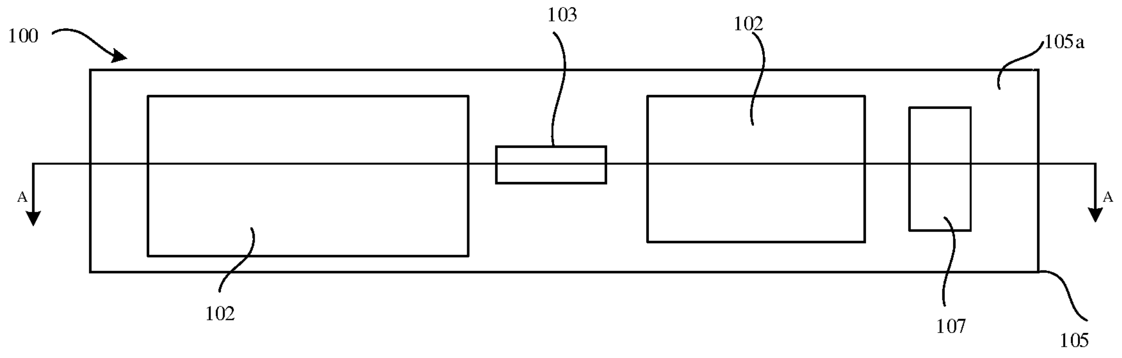
FIG. 1 is a top view of a semiconductor device according to an embodiment of the present application.
Figure 2:
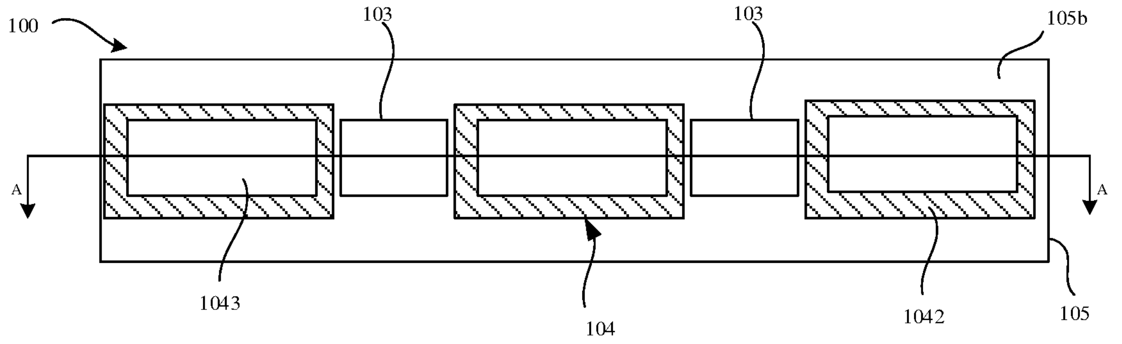
FIG. 2 is a bottom view of the semiconductor device in FIG. 1.
Figure 3:
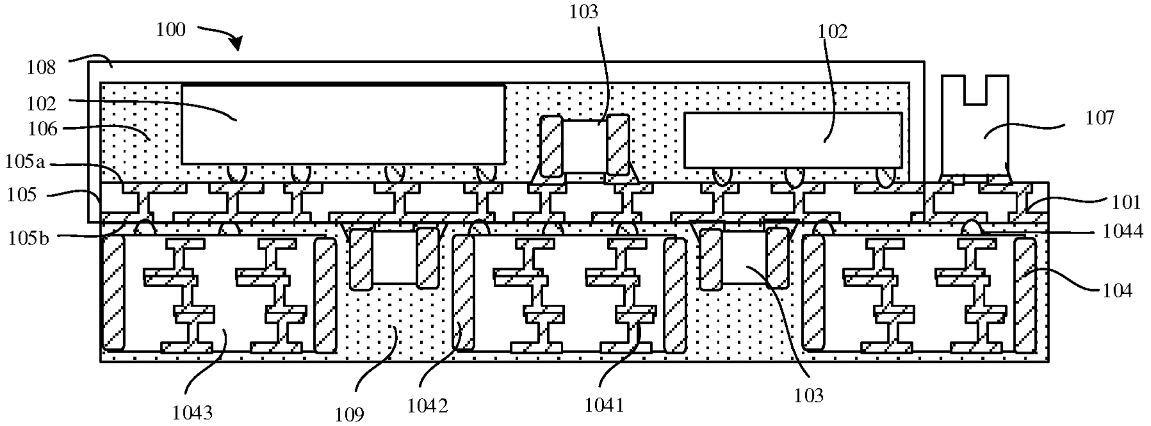
FIG. 3 is a cross-sectional view of the semiconductor device along section lines A-A in FIG. 1 and FIG. 2.

FIGS. 1 to 3 show a semiconductor device 100 according to an embodiment of the present application. FIG. 1 is a top view of the semiconductor device 100, FIG. 2 is a bottom view of the semiconductor device 100, and FIG. 3 is a sectional view along section lines A-A in FIG. 1 and FIG. 2.

As shown in FIGS. 1 to 3, the semiconductor device 100 includes a substrate 105 with one or more substrate conductive patterns 101 embedded therein. The substrate 105 can be a laminate interposer, PCB, wafer-form, strip interposer, leadframe, or another suitable substrate. The substrate 105 may include one or more insulating or passivation layers, one or more conductive vias formed through the insulating layers, and one or more conductive layers formed over or between the insulating layers. The substrate 105 may include one or more laminated layers of polytetrafluoroethylene pre-impregnated, FR-4, FR-1, CEM-1, or CEM-3 with a combination of phenolic cotton paper, epoxy, resin, woven glass, matte glass, polyester, and other reinforcement fibers or fabrics. The insulating layers may contain one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. The substrate 105 can also be a multi-layer flexible laminate, ceramic, copper clad laminate, glass, or semiconductor wafer including an active surface containing one or more transistors, diodes, and other circuit elements to implement analog circuits or digital circuits. The substrate 105 may include one or more electrically conductive layers or redistribution layers (RDL)

formed using sputtering, electrolytic plating, electroless plating, or other suitable deposition process. The substrate conductive patterns 101 may be one or more layers of Al, Cu, Sn, Ni, Au, Ag, titanium (Ti), tungsten (W), or other suitable electrically conductive material.

One or more semiconductor components 102 such as a semiconductor die or a semiconductor package, one or more discrete components 103, one or more antenna modules 104, and a connector 107 can be mounted on the substrate 105. The connector 107 is for coupling the electronic components mounted on the substrate 105 with external devices. Although the semiconductor device 100 is shown as FIGS. 1 to 3 for illustration purpose, those skilled in the art can understand that a semiconductor device may include more semiconductor components and/or discrete components and/or antenna modules, or may not include one or more of the semiconductor components, such as the discrete component or the antenna module. For example, the semiconductor components 102 may include a digital signal processor (DSP), a microcontroller, a microprocessor, a network processor, a power management processor, an audio processor, a video processor, an RF circuit, a wireless baseband system-on-chip (SoC) processor, a sensor, a memory controller, a memory device, an application specific integrated circuit, etc. The discrete components 103 may include one or more passive electrical components such as resistors, capacitors, inductors, etc. In particular, the substrate 105 may have a top surface 105*a* and a bottom surface 105*b* which supports the substrate conductive pattern 101, the semiconductor components 102 and the discrete components 103. In practice, the semiconductor components 102, the discrete components 103 and the antenna modules 104 may be mounted onto the substrate 105 using any suitable surface mounting techniques. In the embodiment shown in FIGS. 1 to 3, the semiconductor components 102 and a portion of the discrete components 103 may be encapsulated by a first encapsulant 106, and the antenna modules 104 and the other portion of the discrete components 103 may be encapsulated by a second encapsulant 109. The encapsulants may be made of a polymer composite material such as epoxy resin with filler, epoxy acrylate with filler, or polymer with proper filler, for example.

As shown in FIGS. 1 and 3, the semiconductor components 102, a portion of the discrete components 103 and the connector 107 are formed on the top surface 105*a* of the substrate 105. As shown in FIGS. 2 and 3, the other portion of the discrete components 103 and the antenna modules 104 are formed on the bottom surface 105*b* of the substrate 105. Since the various electronic components and devices of the semiconductor device 100 are mounted on the opposite sides of the substrate 105, there is more space (at least doubled space) for mounting these components compared with conventional single-side mounting manner. In this way, the size of the semiconductor components 102 to be mounted on the substrate 105 can be bigger for performance improvement. In addition, signal lengths between the semiconductor components 102 mounted on the top surface 105*a* and the discrete devices 103 mounted on the bottom surface 105*b* can be shortened to approximately a thickness of the substrate 105 as they are positioned opposite to each other. In some other embodiments, a smaller number of discrete components 103 or no discrete components 103 may be formed on the top surface 105*a* of the substrate 105.

Electromagnetic interference (EMI) is an issue that needs to be addressed for semiconductor devices. In the embodiment shown in FIGS. 1 to 3, a shielding layer 108 is deposited on the first encapsulant 106 to shield EMI induced to (or generated by) the semiconductor components 102 and the discrete components 103 encapsulated by the first encapsulant 106. In particular, the shielding layer 108 may cover the top surface and the lateral surfaces of the first encapsulant 106. In some embodiments, the first encapsulant 106 may extend further to cover a portion of the lateral walls of the substrate 105. The EMI shielding layer 108 may be made of a conductive material and may be electrically connected to a ground of the semiconductor device 100 or an external ground. In some embodiments, the shielding layer 108 does not cover the connector 107 which is desired to be connected to external devices for signal inputting/outputting purpose.

Since the shielding layer 108 is disposed on the top surface 105*b* of the substrate 105, it cannot cover the components disposed on the other side of the substrate 105, including the discrete components 103 mounted on the bottom surface 105*b*. Further EMI shielding is desired for these discrete components 103. However, since the antenna modules 104 need to transmit to and receive from the exterior environment electromagnetic signals, some of the surfaces of the antenna modules 104 are not desired to be covered by the EMI shielding material. In order to avoid the EMI between the antenna modules 104 and the discrete components 103 mounted on the bottom surface 105*b*, the antenna modules 104 are designed to include special self-shielding structures as elaborated below.

Referring to FIGS. 2 and 3, each antenna module 104 includes an antenna body 1043 which can be made of an insulating or passive material, for example. Within the antenna body 1043, one or more antenna conductive patterns 1041 are formed, which can implement the antenna function. Similar as the substrate conductive patterns 101, the antenna conductive patterns 1041 may be one or more layers of Al, Cu, Sn, Ni, Au, Ag, titanium (Ti), tungsten (W), or other suitable electrically conductive material. The antenna conductive patterns 1041 can be formed using sputtering, electrolytic plating, electroless plating, or other suitable deposition process.

Furthermore, a shielding fence 1042 is formed in the antenna body 1043, or formed over a portion of the antenna body 1043, which at least laterally surrounds the antenna conductive pattern 1041 within the antenna body 1043. Solder connects 1044 are further formed on a top surface of the antenna body 1043 for attaching the antenna module 104 to the substrate 105 and electrically connecting the antenna conductive pattern 1041 to the substrate conductive patterns 101 within the substrate 105. Thus, the antenna conductive patterns 1041 may extend to the top surface of the antenna body 1043 and be in connection with the solder connects 1044. In some examples, the antenna conductive patterns 1041 may extend to the bottom surface of the antenna body 1043 and be exposed from the bottom surface, while in some other examples, the antenna conductive patterns 1041 may not be exposed from the bottom surface of the antenna body 1043. The shielding fence 1042 does not cover the bottom surface of the antenna body 1043 and thus it may not affect the transmitting and receiving of electromagnetic signals through the antenna conductive patterns 1041. In addition, the shielding fences 1042 of the respective antenna modules 104 can significantly reduce the propagation of electromagnetic signals through the lateral surfaces of the antenna modules 104.

As shown in FIG. 3, the discrete component 103 mounted on the bottom surface 105*b* are juxtaposed with the antenna modules 104, for example, surrounding some of the antenna modules 104 or disposed between two adjacent antenna modules 104. In this way, the shielding fences 1041 can be disposed between the antenna conductive pattern 1041 and a discrete component 103 adjacent to the corresponding antenna module 104, and therefore electromagnetic interferences between these two components can be significantly reduced. In some examples, the shielding fences 1041 of two adjacent antenna module 104 can be as close as possible, for example, leaving only a gap that is generally suitable for accommodating a discrete component 103. In this way, an "opening" of a shielding structure formed below the discrete component 103 can be very small, which further helps to reduce EMI transmitted through the "opening". In some embodiment, the shielding fences 1041 of the antenna modules 104 are coupled to a ground line of the substrate 105.

In some embodiments, the shielding fences 1042 can be made of the same material as the antenna conductive patterns 1041. For example, the shielding fences 1042 may include various layers which are formed simultaneously with the respective layers of the antenna conductive patterns 1041. In some other embodiments, the shielding fences 1042 may be made of a different material from the antenna conductive patterns 1041. For example, the shielding fences 1042 can be formed after the antenna conductive patterns 1041. The processes for forming the shielding fences and the antenna modules will be elaborated below with more details.

FIGS. 4A to 4G show a method for making a semiconductor device 100 shown in FIGS. 1 to 3, according to an embodiment of the present application.

Figure 4A:
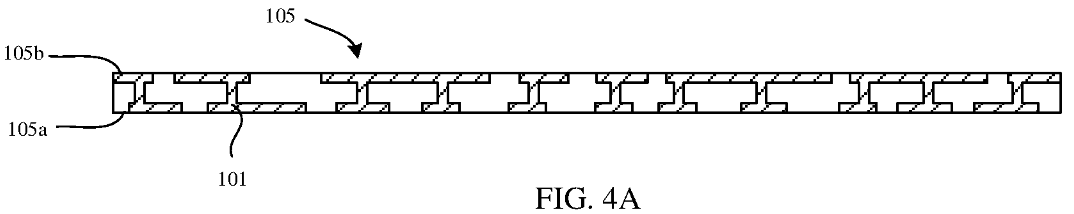
FIGS. 4A to 4G show a method for making a semiconductor device shown in FIGS. 1 to 3.

As illustrated in FIG. 4A, a substrate 105 is provided. The substrate 105 may include a top surface 105*a*, a bottom surface 105*b*, and substrate conductive patterns 101 that extend between the bottom surface 105*b* and the top surface 105*a*. In FIG. 4A, the substrate 105 is reversed with the bottom surface 105*b* oriented upward for subsequent components mounting. A solder paste (not shown) may be deposited or printed onto the substrate conductive patterns 101 at locations where the discrete components and the antenna modules are to be surface mounted onto the bottom surface 105*b*. The solder paste may be dispensed by jet printing, laser printing, pneumatically, by pin transfer, using a photoresist mask, by stencil-printing, or by another suitable process.

Figure 4B:
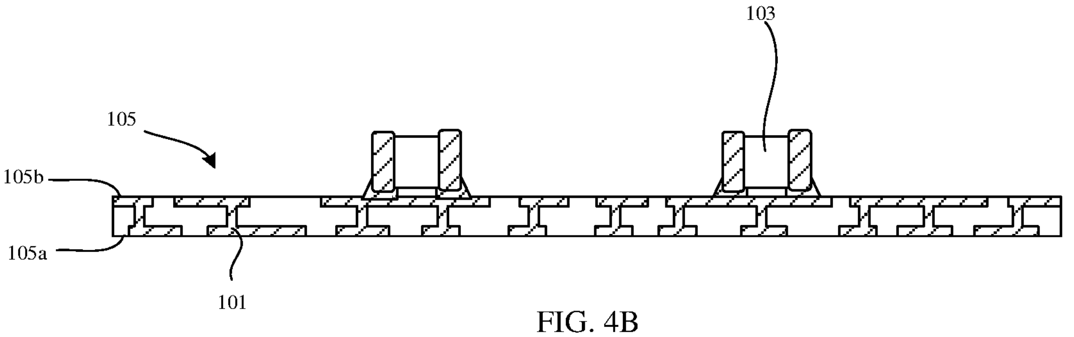
Figure 4C:
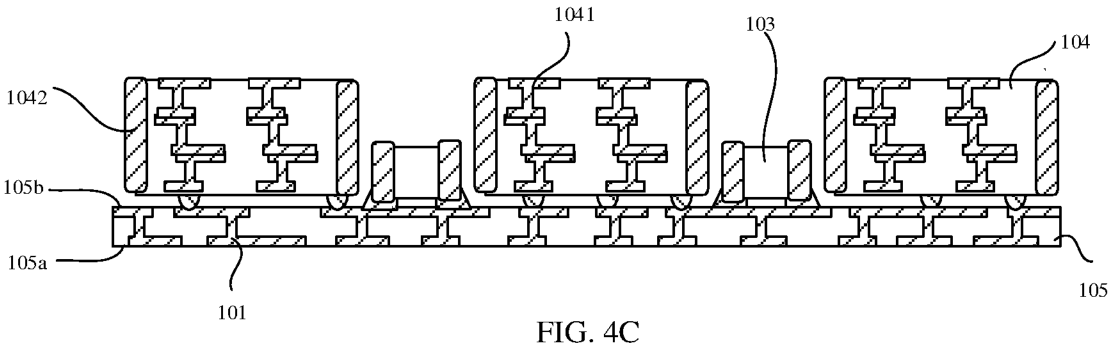

Next, as illustrated in FIG. 4B, various discrete components 103 are disposed over the bottom surface 105*b* of the substrate 105 and in contact with the solder paste. As illustrated in FIG. 4C, the antenna modules 104 may be further disposed over the bottom surface 105*b* of the substrate 105 and in contact with the solder paste. The antenna modules 104 are besides the discrete components 103. Then, the solder paste may be reflowed to mechanically and electrically couple the discrete components 103 and the antenna modules 104 to the substate conductive patterns 101 of the substrate 105. In some alternative embodiments, the discrete components 103 can be mounted onto the bottom surface 105*b* after the antenna modules 104. As can be seen from FIG. 4C, the antenna modules 104 all include shielding fences 1042 for shielding electromagnetic interference between the antenna conductive patterns 1041 and the discrete components 103.

Figure 4D:
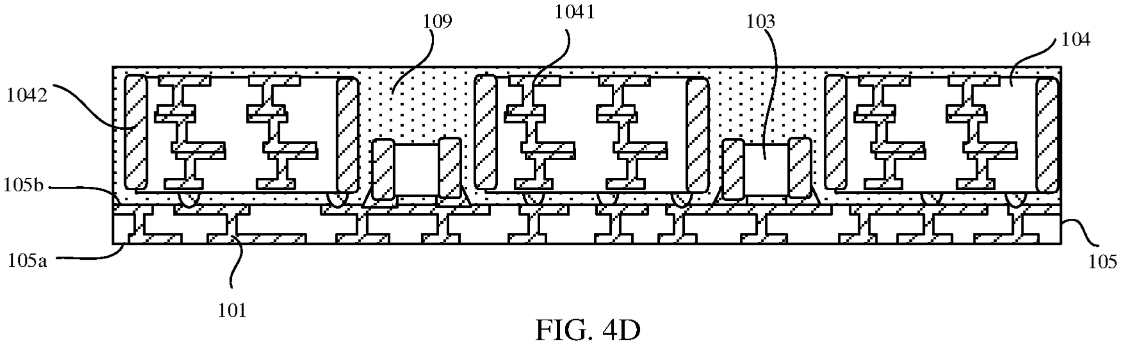

As illustrated in FIG. 4D, a second encapsulant 109 may be formed on the bottom surface 105*b* to prevent the antenna modules 104 and the discrete devices 103 from exterior environment. In particular, a mold (not shown) can be mounted over the bottom surface 105*b* of the substrate 105. The mold may have one or more inlet ports for injecting an encapsulant material thereinto so that the second encapsulant 109 may be formed through an injection molding process.

Figure 4E:
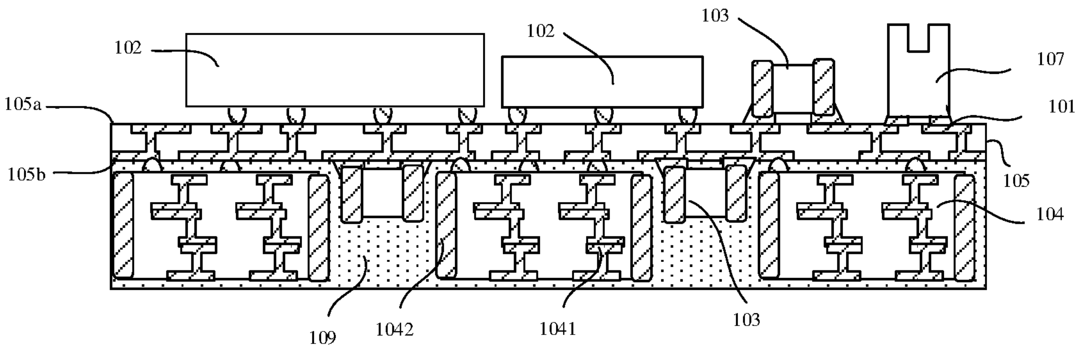

As illustrated in FIG. 4E, the substrate 105 is flipped with the top surface 105*a* oriented upward. Solder paste is patterned onto parts of the substrate conductive patterns 101 on the top surface 105*a* of the substrate 105, and some semiconductor components 102 can be mounted on the top surface 105*a* through the solder paste. Furthermore, a discrete component 103 and a connector 107 are surface mounted on the top surface 105*a* through the solder paste as well.

Figure 4F:
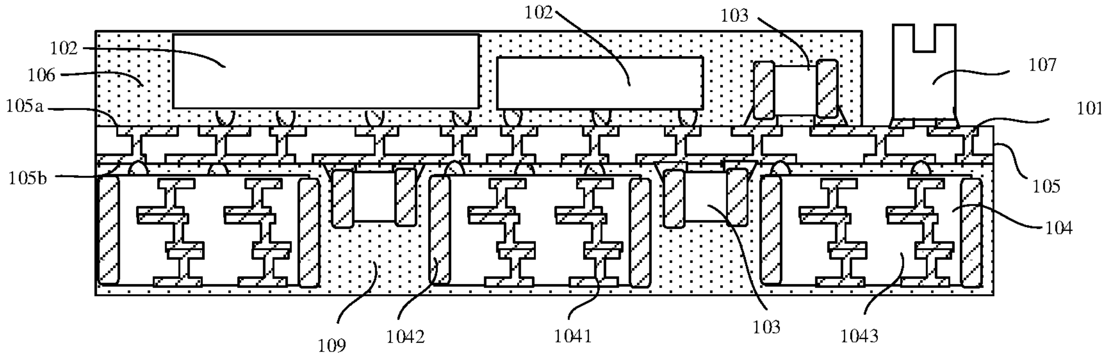
Figure 4G:
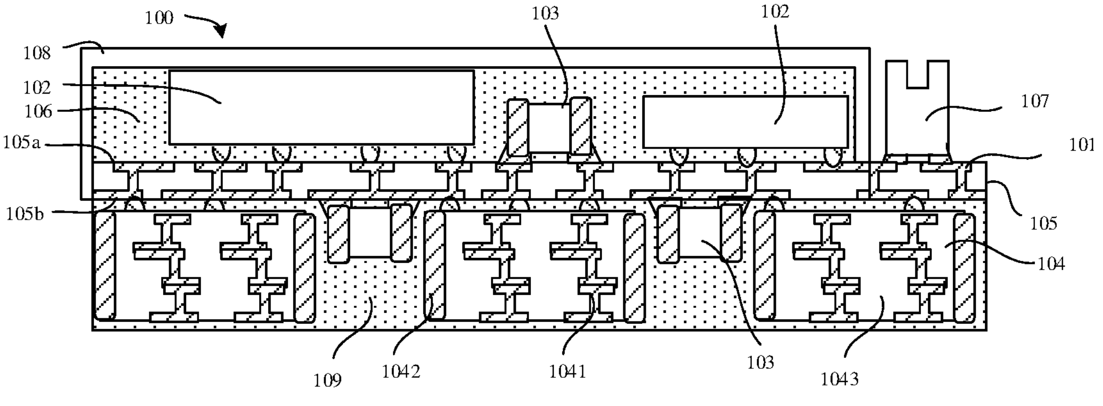

Afterwards, as shown in FIG. 4F, a first encapsulant 106 may be formed on the top surface 105*a* of the substrate 105. The first encapsulant 106 may cover a portion of the components on the top surface 105*a*, such as the semiconductor components 102 and the discrete component 103, but may not cover some other components such as the connector 107. For example, a partial molding process may be used to form the first encapsulant 106. Later, as shown in FIG. 4G, a shielding layer 108 is formed over the first encapsulant 106, with the connector 107 uncovered. The shielding layer 108 may be formed by spray coating, plating, sputtering, or any other suitable metal deposition process. In some embodiments, the shielding layer 108 may be formed from copper, aluminum, iron, or any other suitable material for EMI shielding. A deposition mask can be provided above the connector 107 or any other components that does not require shielding, to avoid the formation of the shielding layer thereon during the selective shielding process.

As aforementioned, various processes can be used to make the antenna modules with shielding fences as described in the above embodiments of the present applications. For example, the shielding fences can be pre-formed within the antenna substrate with the antenna conductive patterns, i.e., using a process for forming the antenna conductive patterns.

Figure 5A:
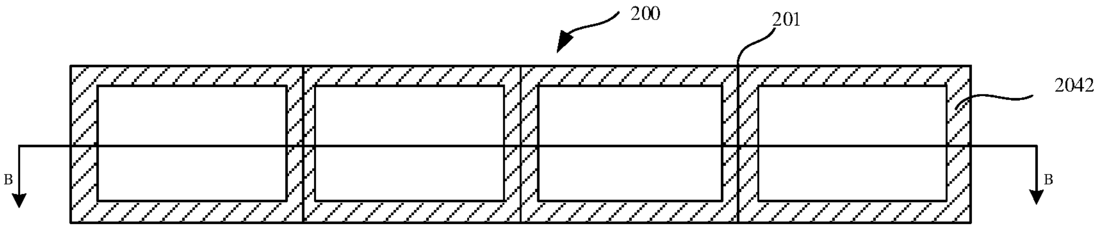
FIGS. 5A to 5C are top views illustrating various steps of the method for making an antenna module according to an embodiment of the present application.
Figure 5B:
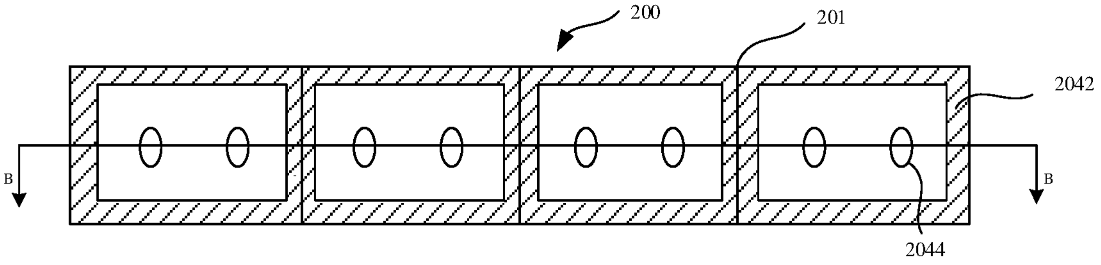
Figure 5C:
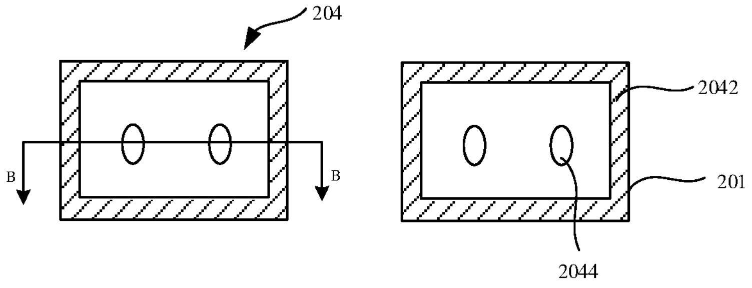
Figure 6A:
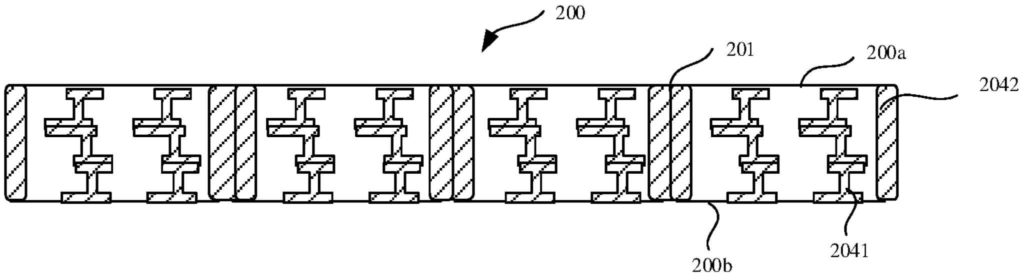
FIGS. 6A to 6C are cross-sectional views of the semiconductor device along section lines B-B according to the steps of the method in FIGS. 5A to 5C.
Figure 6B:
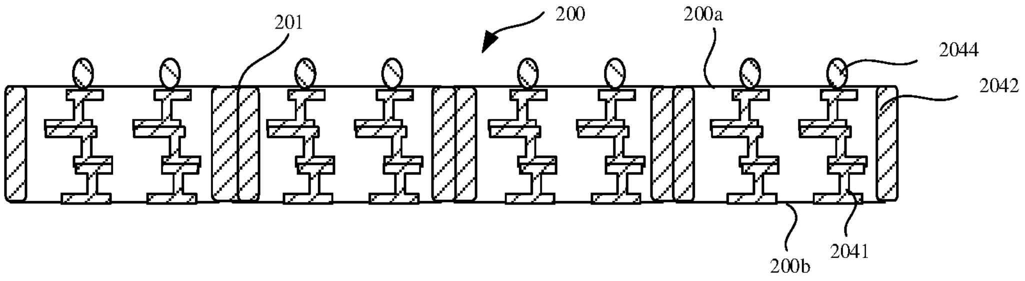
Figure 6C:
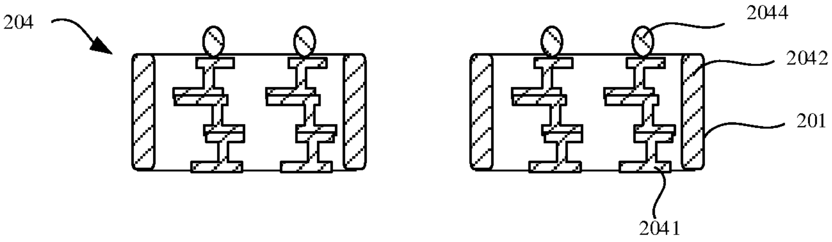

FIGS. 5A to 5C and FIGS. 6A to 6C show a method for making an antenna module according to an embodiment of the present application. FIGS. 5A to 5C are top views illustrating various steps of the method, while FIGS. 6A to 6C are cross-sectional views of the semiconductor device along section lines B-B according to the steps of the method in FIGS. 5A to 5C, respectively.

As illustrated in FIGS. 5A and 6A, an antenna strip 200 with various nonseparated raw antenna modules are provided. The antenna strip 200 includes a top surface 200*a*, a bottom surface 200*b*, a plurality of antenna conductive patterns 2041 and a plurality of shielding fences 2042. Each shielding fence 2042 laterally surrounds an antenna conductive pattern 2041. Furthermore, each two adjacent shielding fences 2042 is connected together at a shared side wall 201. When viewed from the top of the antenna strip 200, the shielding fences 2042 are generally shaped as a square or a rectangle, which may facilitate the subsequent singulation or separation process. However, in some other embodiments, the shielding fences may have some other shapes such as a circular shape, an oval shape, or a regular hexagonal shape, which is not limited herein.

Next, as illustrated in FIGS. 5B and 6B, alternatively, solder connects 2044 are mounted on the bottom surface 200*b* of the antenna strip 200. The solder connects 2044 are electrically connected to the plurality of antenna conductive patterns 2041, respectively.

Afterwards, as illustrated in FIGS. 5C and 6C, the antenna strip 200 can be singulated at the shared side walls 201 of each two adjacent shielding fences 2042 to separate the raw antenna modules from each other. It can be appreciated that the shared side walls 201 are thicker than a corresponding portion of the antenna strip 200 that is removed due to the singulation, therefore the remaining parts of the shared side wall 201 may serve as two sidewalls of the shielding fences 2042 of two antenna modules 204. Each of the separated antenna conductive patterns 2041 is laterally surrounded by a shielding fence 2042 after the singulation.

It should be noted that in the embodiments shown in FIGS. 5A to 5C and FIGS. 6A to 6C, the antenna strip has only a row of nonseparated raw antenna modules. In some other embodiments, the antenna strip may have an array of raw antenna modules which include multiple rows and multiple columns. In such embodiments, the antenna strips can be similarly singulated to form the antenna modules using any suitable processes, such as a singulation saw or a laser beam.

Figure 7A:
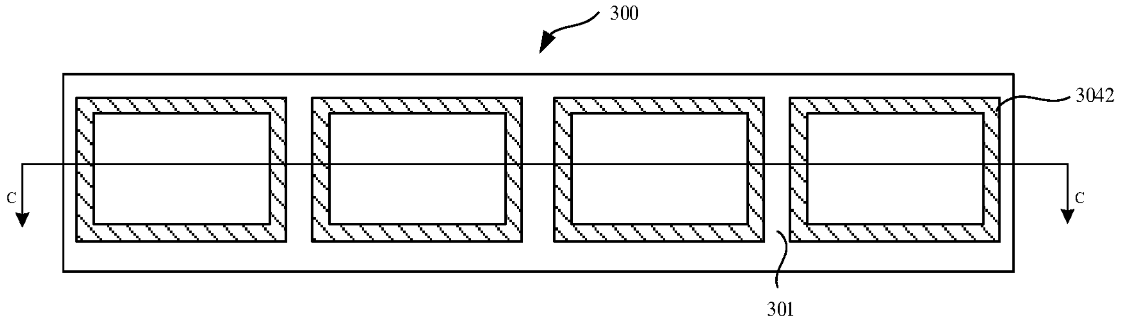
FIGS. 7A to 7C are top views illustrating various steps of the method for making an antenna module according to another embodiment of the present application.
Figure 7B:
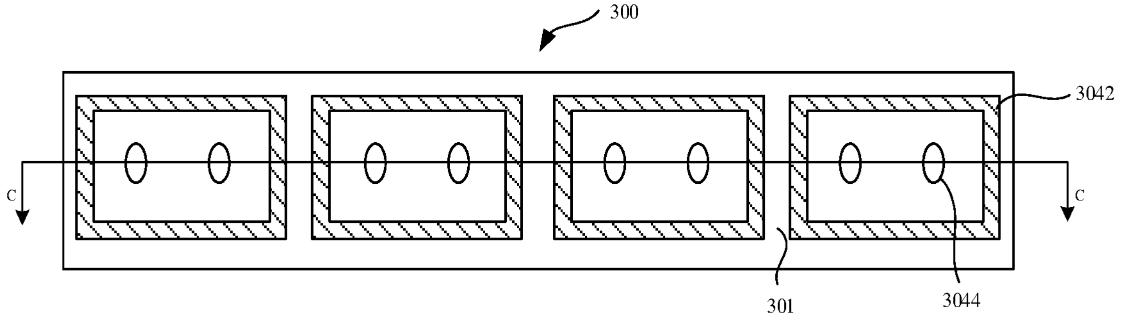
Figure 7C:
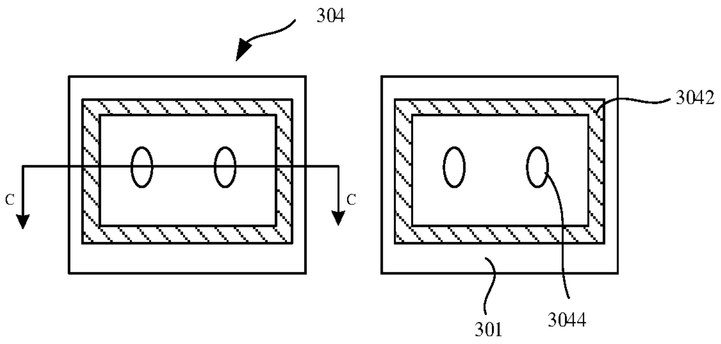
Figure 8A:
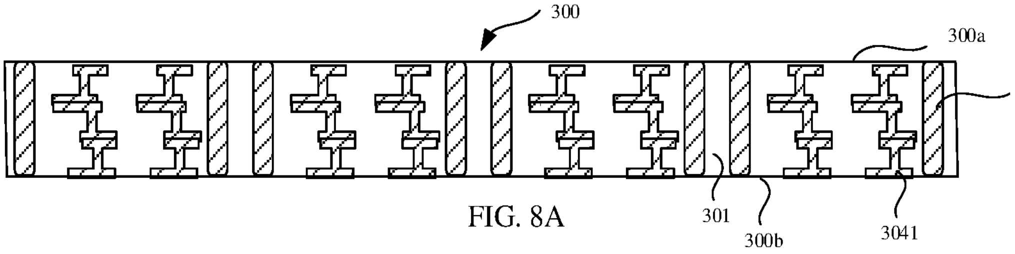
FIGS. 8A to 8C are cross-sectional views of the semiconductor device along section lines C-C according to the steps of the method in FIGS. 7A to 7C.
Figure 8B:
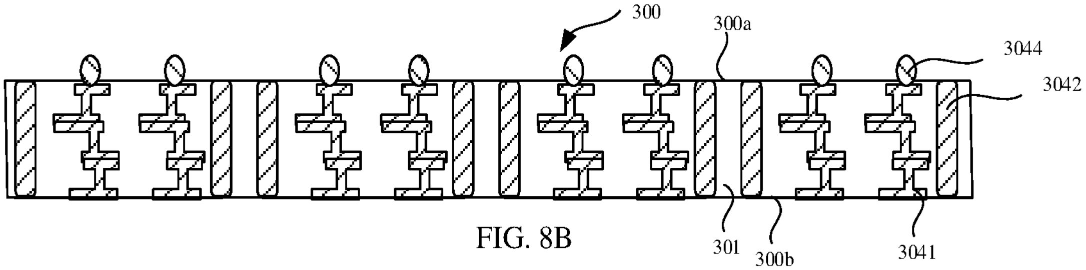
Figure 8C:
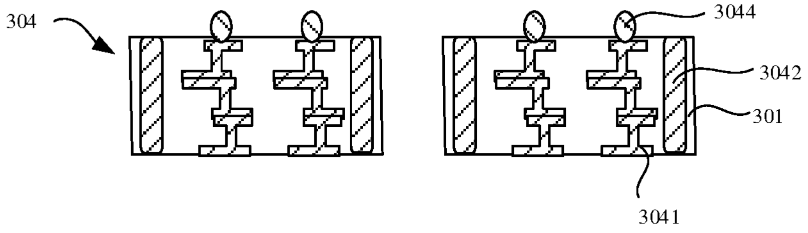

FIGS. 7A to 7C and FIGS. 8A to 8C show a method for making an antenna module according to another embodiment of the present application. FIGS. 7A to 7C are top views illustrating various step of the method, while FIGS. 8A to 8C are cross-sectional views of the semiconductor device along section lines C-C according to the steps of the method in FIGS. 7A to 7C, respectively.

As illustrated in FIGS. 7A and 8A, an antenna strip 300 with various nonseparated raw antenna modules is provided. The antenna strip 300 includes a top surface 300*a*, a bottom surface 300*b*, a plurality of antenna conductive patterns 3041 and a plurality of shielding fences 3042. Different from the antenna strip 200 shown in FIGS. 5A and 6A, an isolation area 301 is formed between each two adjacent shielding fences 3042 to isolate the shielding fences 3042 from each other.

Next, as illustrated in FIGS. 7B and 8B, solder connects 3044 are mounted on the bottom surface 300*b* of the antenna strip 300. The solder connects 3044 are electrically connected to the plurality of antenna conductive patterns 3041, respectively.

Afterwards, as illustrated in FIGS. 7C and 8C, the antenna strip 300 can be singulated at the isolation areas 301 to separate the plurality of antenna conductive patterns 3041 from each other. In some embodiments, the isolation areas 301 are thicker than a corresponding portion of the antenna strip 300 that is removed due to the singulation, therefore the remaining parts of the isolation areas 301 may serve as two sidewalls of two antenna modules 304, respectively. In this way, the shielding fences 3042 may not be exposed and thus be protected by the remaining parts of the isolation areas 301. In some other embodiments, the isolation areas 301 may be equal to or thinner than a corresponding portion of the antenna strip 300 that is removed due to the singulation, therefore the shielding fences 3042 may be exposed.

The above embodiments show the method for making antenna modules with pre-formed shielding fences. In some other embodiments, the shielding fences can be formed at a later stage, e.g., after the forming of the antenna conductive patterns. FIGS. 9A to 9F and FIGS. 10A to 10F show such methods.

FIGS. 9A to 9F show steps of a method for making an antenna module according to yet another embodiment of the present application.

Figure 9A:
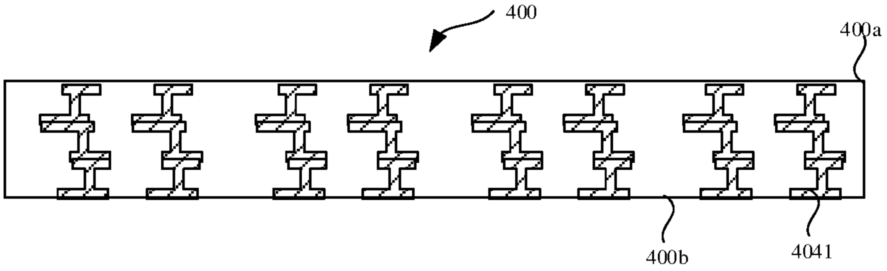
FIGS. 9A to 9F show steps of a method for making an antenna module according to yet another embodiment of the present application.
Figure 9B:
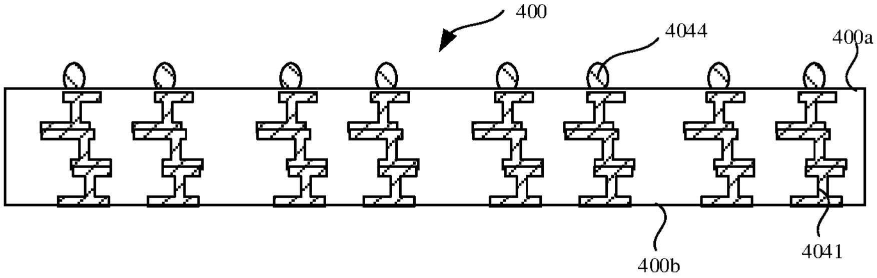

As illustrated in FIG. 9A, an antenna strip 400 is provided. The antenna strip 400 includes a top surface 400*a*, a bottom surface 400*b* and a plurality of antenna conductive patterns 4041. As illustrated in FIG. 9B, solder connects 4044 which are electrically connected with the antenna conductive patterns 4041 are formed on the top surface 400*a* of the antenna strip 400.

Figure 9C:
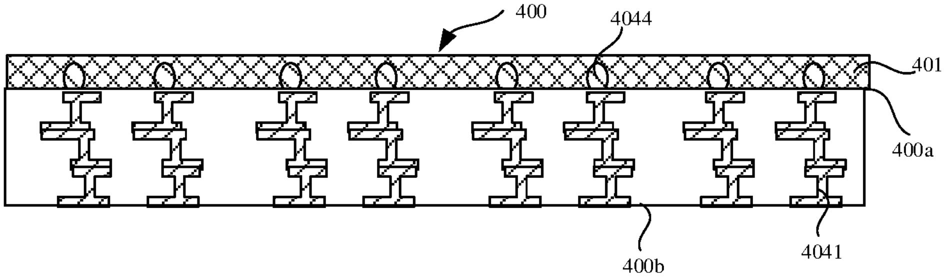
Figure 9D:
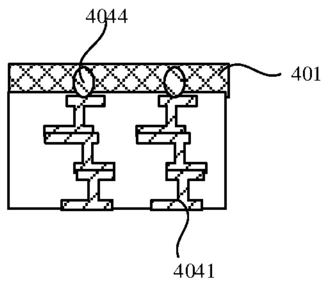
Figure 9E:
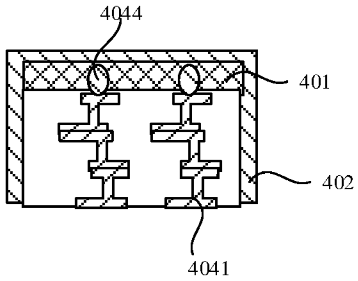
Figure 9F:
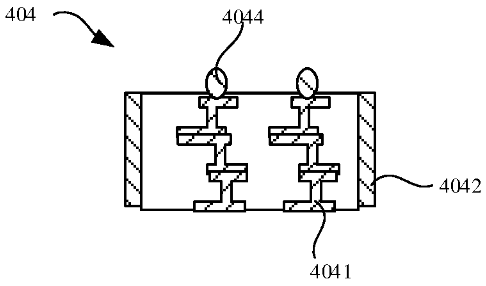

Next, as illustrated in FIG. 9C, a deposition mask 401 is attached on the top surface 400*a* of the antenna strip 400. The deposition mask 401 covers the solder connects 4044 on the top surface 400*a*. In some embodiments, the deposition mask 401 may be a tape such as a polyimide tape; in some other embodiments, the deposition mask 401 may be photoresist or other similar coatings that may be easily removed off the antenna strip 400. The antenna strip 400 can be singulated to separate the plurality of antenna conductive patterns 4041 from each other, as shown in FIG. 9D. Referring to FIG. 9E, a shielding material 402 is deposited on the deposition mask 401 and lateral surfaces of each separated antenna module. The shielding material 402 can be a conductive material (e.g., metal) the same as or different from the antenna conductive pattern 4041. Later, as shown in FIG. 9F, the deposition mask 401 can be removed from the antenna module, along with the shielding materials over the deposition mask 401. That is, the shielding materials is partially removed in a lift-off manner. In this way, only the shielding material on the sidewalls of the antenna module forms a shielding fence 4042.

FIGS. 10A to 10F show steps of a method for making an antenna module 504 according to yet another embodiment of the present application. The method is similar to that shown in FIGS. 9A to 9F, except that the deposition mask is attached on a bottom surface of the antenna strip, rather than on the top surface.

Figure 10A:
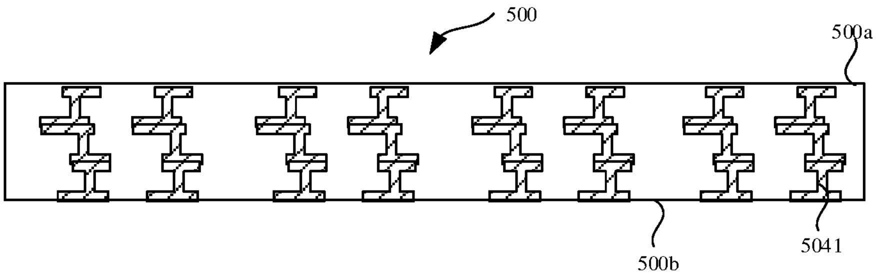
FIGS. 10A to 10F show steps of a method for making an antenna module according to yet another embodiment of the present application.
Figure 10B:
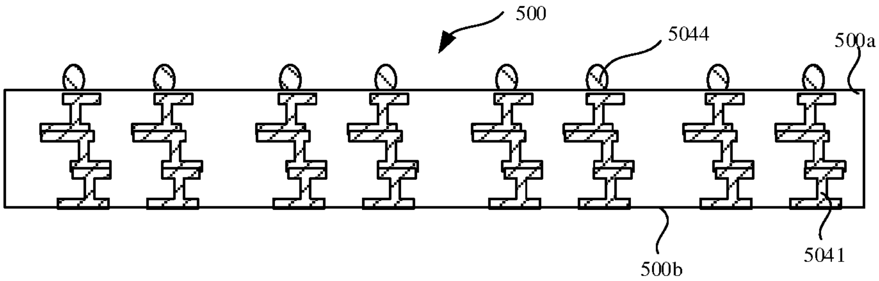
Figure 10C:
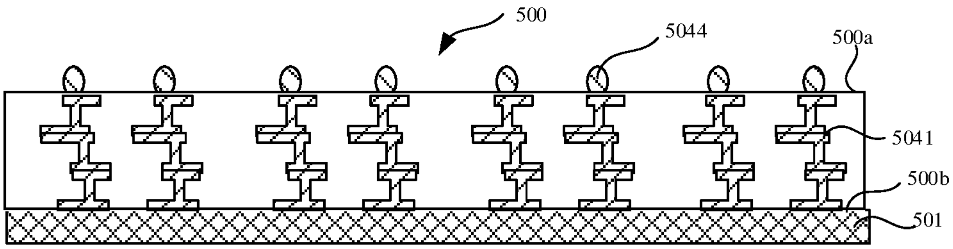
Figure 10D:
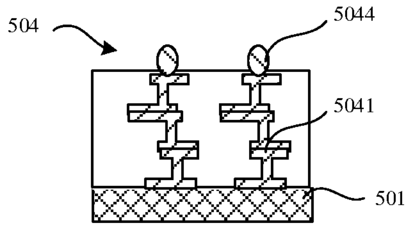
Figure 10E:
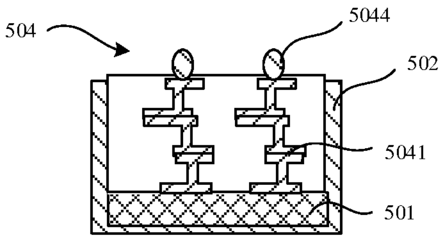
Figure 10F:
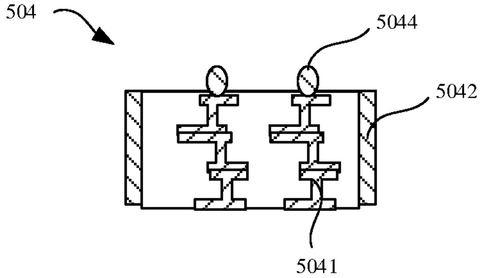

As illustrated in FIG. 10A, an antenna strip 500 with a plurality of antenna conductive patterns 5041 is provided. Solder connects 5044 which are electrically connected with the antenna conductive patterns 5041 are formed on the antenna strip 500, as shown in FIG. 10B. Next, as illustrated in FIG. 10C, a deposition mask 501 is attached on the bottom surface 500*b* of the antenna strip 500. The antenna strip 500 can be singulated to separate the plurality of antenna conductive patterns 5041 from each other, as shown in FIG. 10D. Referring to FIG. 10E, a shielding material 502 is deposited on the deposition mask 501 and lateral surfaces of each separated antenna module. Later, as shown in FIG. 10F, the deposition mask 501 can be removed from the antenna module, along with the shielding materials over the deposition mask 501. That is, the shielding materials is partially removed in a lift-off manner. In this way, only the shielding material on the sidewalls of the antenna module forms a shielding fence 5042.

The discussion herein included numerous illustrative figures that showed various portions of an electronic package assembly and method of manufacturing thereof. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A method for making an antenna module, comprising:

providing an antenna strip, wherein the antenna strip comprises a plurality of antenna conductive patterns and a plurality of shielding fences each laterally surrounding an antenna conductive pattern, wherein each two adjacent shielding fences is connected together at a shared side wall; and singulating the antenna strip at the shared side walls of each two adjacent shielding fences to separate the plurality of antenna conductive patterns from each other to form a plurality of antenna modules, wherein the shared side walls are thicker than a corresponding portion of the antenna strip that is removed due to the singulation such that each of the separated antenna conductive patterns is laterally surrounded by a shielding fence after the singulation for laterally shielding electromagnetic interferences, wherein each of the separated antenna module is attached to an external substrate through a first surface of the antenna module, and transmits and receives electromagnetic signals through a second surface of the antenna module opposite to the first surface.

2. The method of claim 1, wherein the shielding fence of each antenna module is formed on lateral surfaces of each antenna module.

3. The method of claim 1, wherein each antenna module further comprises a plurality of solder connects on the first surface of the antenna module for attaching the antenna module to the external substrate.

4. The method of claim 1, wherein the shielding fence of each antenna module extends between the first surface and the second surface of the antenna module.

5. The method of claim 1, wherein the shielding fence of each antenna module is made of the same material as the antenna conductive pattern of each antenna module.

6. A method for making an antenna module, comprising:

providing an antenna strip, wherein the antenna strip comprises a plurality of antenna conductive patterns and a plurality of shielding fences each laterally surrounding an antenna conductive pattern, wherein each two adjacent shielding fences is spaced apart from each other via an isolation area; and singulating the antenna strip at the isolation areas to separate the plurality of antenna conductive patterns from each other to form a plurality of antenna modules, wherein the isolation areas are thicker than a corresponding portion of the antenna strip that is removed due to the singulation such that each of the separated antenna conductive patterns is laterally surrounded by a shielding fence after the singulation for laterally shielding electromagnetic interferences, wherein each of the separated antenna module is attached to an external substrate through a first surface of the antenna module, and transmits and receives electromagnetic signals through a second surface of the antenna module opposite to the first surface.

7. The method of claim 6, wherein the shielding fence of each antenna module is formed within of each antenna module.

8. The method of claim 6, wherein each antenna module further comprises a plurality of solder connects on the first surface of the antenna module for attaching the antenna module to the external substrate.

9. The method of claim 6, wherein the shielding fence of each antenna module extends between the first surface and the second surface of the antenna module.

10. The method of claim 6, wherein the shielding fence of each antenna module is made of the same material as the antenna conductive pattern of each antenna module.

11. A semiconductor device, comprising:

a substrate comprising a first surface, a second surface opposite to the first surface, and substrate conductive patterns that extend between the first surface and the second surface;

an antenna module attached on the first surface of the substrate, the antenna module comprising:

an antenna body, an antenna conductive pattern formed within the antenna body, and a shielding fence laterally surrounding the antenna conductive pattern for shielding electromagnetic interferences;

a first electronic component attached on the first surface of the substrate and besides the antenna module;

a second electronic component attached on the second surface of the substrate, wherein the second electronic component is coupled to the first electronic component and the antenna module through at least two of the substrate conductive patterns; and a shielding layer formed on the second electronic component for shielding electronic interferences.

12. The semiconductor device of claim 11, wherein the shielding fence is formed within the antenna body.

13. The semiconductor device of claim 11, wherein the shielding fence is formed on lateral surfaces of the antenna body.

14. The semiconductor device of claim 11, wherein the antenna module comprises a plurality of solder connects on the antenna body for attaching the antenna module on the first surface of the substrate.

15. The semiconductor device of claim 11, wherein the shielding fence extends between a first surface and a second surface of the antenna body, wherein the first surface is opposite to the second surface.

16. The semiconductor device of claim 11, wherein the shielding fence is made of the same material as the antenna conductive pattern.

17. The semiconductor device of claim 11, wherein the shielding fence is coupled to a ground line of the substrate.

* * * * *